United States Patent
Guo et al.

(10) Patent No.: US 10,804,918 B2
(45) Date of Patent: Oct. 13, 2020

(54) SOC BASEBAND CHIP AND MISMATCH CALIBRATION CIRCUIT FOR A CURRENT STEERING DIGITAL-TO-ANALOG CONVERTER THEREOF

(71) Applicant: Radiawave Technologies Co., Ltd., Shenzhen (CN)

(72) Inventors: Xiaofeng Guo, Shenzhen (CN); Jon Sweat Duster, Beaverton, OR (US); Haigang Feng, Shenzhen (CN); Ning Zhang, Shenzhen (CN); Yulin Tan, Shenzhen (CN)

(73) Assignee: Radiawave Technologies Co., Ltd., Shenzhen (CN)

(*) Notice: Subject to any disclaimer, the term of this patent is extended or adjusted under 35 U.S.C. 154(b) by 0 days.

(21) Appl. No.: 16/628,984

(22) PCT Filed: Oct. 25, 2018

(86) PCT No.: PCT/CN2018/111967
§ 371 (c)(1),
(2) Date: Jan. 6, 2020

(87) PCT Pub. No.: WO2019/080911
PCT Pub. Date: May 2, 2019

(65) Prior Publication Data
US 2020/0127675 A1   Apr. 23, 2020

(30) Foreign Application Priority Data
Oct. 25, 2017  (CN) .......................... 2017 1 1012267

(51) Int. Cl.
*H03M 1/10* (2006.01)
*G05F 1/56* (2006.01)
*H03M 1/74* (2006.01)

(52) U.S. Cl.
CPC .......... *H03M 1/1009* (2013.01); *G05F 1/561* (2013.01); *H03M 1/1057* (2013.01); *H03M 1/745* (2013.01)

(58) Field of Classification Search
CPC .. H03M 1/1009; H03M 1/745; H03M 1/1057; G05F 1/561
(Continued)

(56) References Cited

U.S. PATENT DOCUMENTS

| | | | |
|---|---|---|---|
| 9,046,908 B2* | 6/2015 | Gong | ........................ G05F 1/46 |
| 9,379,728 B1 | 6/2016 | Singh et al. | |
| 2002/0186156 A1 | 12/2002 | Inagaki et al. | |
| 2009/0201186 A1 | 8/2009 | Huang et al. | |

FOREIGN PATENT DOCUMENTS

| | | |
|---|---|---|
| CN | 101777914 A | 7/2010 |
| CN | 102064931 A | 5/2011 |

(Continued)

OTHER PUBLICATIONS

First Office Action in counterpart Chinese application 201711012267.2, dated Jul. 4, 2018.
(Continued)

*Primary Examiner* — Khai M Nguyen
(74) *Attorney, Agent, or Firm* — Westbridge IP LLC

(57) ABSTRACT

The present disclosure relates to a mismatch calibration circuit for a current steering DAC of a SoC baseband chip and a SoC baseband chip. The mismatch calibration circuit includes current mirror compensation circuits, a calibration switching switch module, a calibration resistor, a voltage detection module, and a calibration control module. The resistance of the calibration resistor is $2^N-1$ times the resistance of the load resistor, where N is the number of MSBs. The number of the current mirror compensation circuits is equal to the number of the MSB current mirror branches. The current mirror compensation circuits are
(Continued)

connected in parallel with the MSB current mirror branches to form current mirror parallel branches. The present disclosure minimizes mismatch error between the output currents of the current mirror array in the SoC baseband chip of 28 nm process or even a smaller process dimension, thereby improving conversion accuracy of the DAC.

20 Claims, 4 Drawing Sheets

(58) Field of Classification Search
USPC .................................... 341/120, 135, 144
See application file for complete search history.

(56) References Cited

FOREIGN PATENT DOCUMENTS

| CN | 103840832 A | 6/2014 |
|---|---|---|
| CN | 104617953 A | 5/2015 |
| CN | 105204563 A | 12/2015 |
| CN | 107819465 A | 3/2018 |

OTHER PUBLICATIONS

International Search Report in corresponding PCT application PCT/CN2018/111967, dated Jan. 22, 2019.
Zhu et al., Digitial Static Calibration Technology for 16-Bit D/A Converter, Microelectronics, Feb. 2010, pp. 24-28, vol. 40, No. 1, China.

* cited by examiner

SOC BASEBAND CHIP AND MISMATCH CALIBRATION CIRCUIT FOR A CURRENT STEERING DIGITAL-TO-ANALOG CONVERTER THEREOF

CROSS-REFERENCE TO RELATED APPLICATION

The present application is a National Stage of International Application No. PCT/CN2018/111967, filed Oct. 25, 2018, which claims the benefit of Chinese Patent Application No. 201711012267.2, filed Oct. 25, 2017 with the State Intellectual Property Office of China and entitled "SoC baseband chip and mismatch calibration circuit for a current steering digital-to-analog converter thereof", the entirety of which is hereby incorporated herein by reference.

FIELD

The present disclosure relates to the field of integrated circuits, and more particularly relates to a SoC baseband chip and a mismatch calibration circuit for a current steering digital-to-analog converter of a SoC baseband chip.

BACKGROUND

A system-on-chip (SoC) baseband chip has two orthogonal signal channels, namely an I channel and a Q channel. Each of the two channels has a digital-to-analog converter (DAC), each DAC being symmetrical to the other and including a current mirror array. The DAC in the SoC baseband chip is typically a current steering DAC. FIG. 1 is a structural schematic view of part of a current steering DAC of a SoC baseband chip according to the related art, including an input power supply VDD, a current mirror array 101, a switch array 102, and a load resistor $R_L$. The current mirror array 101 is in a segmented structure, consisting of most significant bit (MSB) current mirror cells, upper least significant bit (ULSB) current mirror cells, least significant bit (LSB) current mirror cells, and lower least significant bit (LLSB) current mirror cells. The MSB current mirror cells in the I channel and the Q channel each include $2^N-1$ MSB current mirror branches, where N is the number of bits of the most significant bit cells. For example, as shown in FIG. 1, if the MSB cells contain 3 bits, the current steering DACs in the I channel and the Q channel each includes seven current mirror branches, namely the current mirror branches M1 to M7.

The current steering DAC in the SoC baseband chip aims to generate a series of reference currents through the current mirror array in the DAC (as shown in FIG. 1, for example, a reference current Iu, a reference current 128Iu in the form of a seven-branch thermometer code in the MSB cells, a reference current 16Iu in the form of a seven-branch thermometer code in the ULSB cells, a reference current 2Iu in the form of a seven-branch thermometer code in the LSB cells, and binarized reference currents Iu, ½Iu, ¼Iu in the LLSB cells, all of which form a 12-bit DAC), and control flows of these reference currents by an input digital code. The accuracy of these reference currents directly determines conversion accuracy of the DAC. In order to ensure the linearity of the DAC, the MSB cells are in the form of the thermometer code. Since the accuracy of the MSB cells determines the DAC linearity, the MSB cells are subjected to the calibration for the output currents of the current mirror array in the DAC.

The DAC it is considered as a most accurate module in the entire chip system due to its high accuracy requirement and its output being analog. The calibration for the DAC is difficult. Unless the error of the DAC can be amplified, there merely exist two manners for reducing influence of the mismatch on the DAC linearity, one by using a larger layout board, and the other one by dynamic element matching (DEM). The two manners are effective for the mismatch calibration of the output currents of the DAC current mirror array in the SoC baseband chip of a large process dimension. However, for the SoC baseband chip of 28 nm or even a smaller process dimension, due to a more serious mismatch between the output currents of the DAC current mirror array, neither of the two manners is ideal.

SUMMARY

It is an object of the present disclosure to provide a mismatch calibration circuit for a current steering digital-to-analog of a SoC baseband chip and a SoC baseband chip, aiming to reduce mismatch error occurring between the output currents of the current mirror array in the SoC baseband chip using 28 nm process or even a smaller process dimension, thereby improving conversion accuracy of the digital-to-analog.

In one aspect, the present disclosure provides a mismatch calibration circuit for a current steering digital-to-analog converter of a SoC baseband chip, including current mirror compensation circuits, a calibration switching switch module, a calibration resistor, a voltage detection module, and a calibration control module;

a resistance value of the calibration resistor is $2^N-1$ times as a resistance value of a load resistor in the current steering digital-to-analog converter, wherein N is the number of bits of MSB cells;

the number of the current mirror compensation circuits is equal to the number of MSB current mirror branches in the current steering digital-to-analog converter, each of the current mirror compensation circuits is connected in parallel with each of the MSB current mirror branches to form each of current mirror parallel branches; an input end of the calibration switching switch module is connected to the current mirror parallel branches, and an output end of the calibration switching switch module is grounded respectively via the calibration resistor and the load resistor; the voltage detection module is respectively connected to the calibration resistor and the calibration control module; the calibration control module is respectively connected to the MSB current mirror branches, the current mirror compensation circuits, and the calibration switching switch module;

the current mirror compensation circuits are configured to supply compensation currents for the MSB current mirror branches; the calibration switching switch module is configured to, under control of the calibration control module, sequentially connect one of the current mirror parallel branches to the calibration resistor, and the other current mirror parallel branches to the load resistor; and the calibration control module is configured to, according to output currents of the MSB current mirror branches, determine a reference current, and control the current mirror compensation circuits to supply the compensation currents; the calibration resistor is configured to sample currents of the current mirror parallel branches, convert the sampled currents to voltage signals and send the voltage signals to the voltage detection module; the voltage detection module is configured to detect the voltage signals, and feed back detection results to the calibration control module; and the calibration control module is configured to adjust the compensation currents of the current mirror compensation circuits, so as to calibrate output currents of a current mirror array in the current steering digital-to-analog converter.

In some embodiments, the calibration control module is configured to, according to the output currents of the MSB current mirror branches, determine one of the output currents of the current mirror parallel branches as the reference current, and control the current mirror compensation circuits to supply the compensation currents for the corresponding MSB current mirror branches according to the reference current. Alternatively, the calibration control module is configured to, according to the output currents of the MSB current mirror branches, determine an average value of the output currents of all of the current mirror parallel branches as the reference current, and control the current mirror compensation circuits to supply the compensation currents for the corresponding MSB current mirror branches according to the reference current.

In some embodiments, the voltage detection module is configured to take the voltage signal corresponding to the output current of one of the current mirror parallel branches first sampled by the calibration resistor as a reference voltage, take the voltage signals corresponding to the output currents of the other current mirror parallel branches subsequently sampled by the calibration resistor as respective detection voltages, and sequentially compare each of the detection voltages with the reference voltage, until each of the detection voltages is equal to or larger than the reference voltage, or the compensation current supplied by the corresponding current mirror compensation circuit reaches a maximum compensation current.

In some embodiments, the voltage detection module is configured to be a voltage comparator, or an analog-to-digital converter in the SoC baseband chip.

In some embodiments, each of the current mirror compensation circuits includes at least one current mirror compensation branch, and the current mirror compensation branch is connected in parallel with the corresponding MSB current mirror branch.

In some embodiments, the current mirror compensation branch includes a first MOS transistor, a second MOS transistor, a third MOS transistor, a fourth MOS transistor, and a fifth MOS transistor.

A gate of the first MOS transistor, a gate of the second MOS transistor, a gate of the third MOS transistor, and a gate of the fourth MOS transistor are connected with each other and are connected to the calibration control module; a drain of the first MOS transistor, a drain of the second MOS transistor, a drain of the third MOS transistor, and a drain of the fourth MOS transistor are connected to an input power of the current steering digital-to-analog converter; a source of the first MOS transistor, a source of the second MOS transistor, a source of the third MOS transistor, and a source of the fourth MOS transistor are connected to a drain of the fifth MOS transistor; a gate of the fifth MOS transistor is connected to the calibration control module, and a source of the fifth MOS transistor is connected to the calibration switching switch module.

In some embodiments, the calibration switching switch module includes at least one switching switch branch. The number of the switching switch branches is equal to the number of the current mirror parallel branches; each of the switching switch branches is respectively connected to each of the current mirror parallel branches and the calibration control module, and respectively connected to the calibration resistor and the load resistor; and each of the switching switch branches is configured to connect the current mirror parallel branch connected thereto to the calibration resistor or to the load resistor.

In some embodiments, the switching switch branch includes a sixth MOS transistor and a seventh MOS transistor.

A gate of the sixth MOS transistor and a gate of the seventh MOS transistor are connected to the calibration control module; a drain of the sixth MOS transistor and a drain of the seventh MOS transistor are connected to the corresponding current mirror parallel branch; and a source of the sixth MOS transistor is grounded via the calibration resistor, and a source of the seventh MOS transistor is grounded via the load resistor.

In another aspect, the present disclosure provides a SoC baseband chip, including a mismatch calibration circuit for a current steering digital-to-analog converter. The mismatch calibration circuit includes current mirror compensation circuits, a calibration switching switch module, a calibration resistor, a voltage detection module, and a calibration control module;

a resistance value of the calibration resistor is $2^N-1$ times as a resistance value of a load resistor in the current steering digital-to-analog converter, wherein N is the number of bits of MSB cells;

the number of the current mirror compensation circuits is equal to the number of MSB current mirror branches in the current steering digital-to-analog converter, each of the current mirror compensation circuits is connected in parallel with each of the MSB current mirror branches to form each of current mirror parallel branches; an input end of the calibration switching switch module is connected to the current mirror parallel branches, and an output end of the calibration switching switch module is grounded respectively via the calibration resistor and the load resistor; the voltage detection module is respectively connected to the calibration resistor and the calibration control module; the calibration control module is respectively connected to the MSB current mirror branches, the current mirror compensation circuits, and the calibration switching switch module;

the current mirror compensation circuits are configured to supply compensation currents for the MSB current mirror branches; the calibration switching switch module is configured to, under control of the calibration control module, sequentially connect one of the current mirror parallel branches to the calibration resistor, and the other current mirror parallel branches to the load resistor; and the calibration control module is configured to, according to output currents of the MSB current mirror branches, determine a reference current, and control the current mirror compensation circuits to supply the compensation currents; the calibration resistor is configured to sample currents of the current mirror parallel branches, convert the sampled currents to voltage signals and send the voltage signals to the voltage detection module; the voltage detection module is configured to detect the voltage signals, and feed back detection results to the calibration control module; and the calibration control module is configured to adjust the compensation currents of the current mirror compensation circuits, so as to calibrate output currents of a current mirror array in the current steering digital-to-analog converter.

In some embodiments, the calibration control module is configured to, according to the output currents of the MSB current mirror branches, determine one of the output currents of the current mirror parallel branches as the reference current, and control the current mirror compensation circuits to supply the compensation currents for the corresponding MSB current mirror branches according to the reference current.

In some embodiments, the calibration control module is configured to, according to the output currents of the MSB current mirror branches, determine an average value of the output currents of all of the current mirror parallel branches as the reference current, and control the current mirror compensation circuits to supply the compensation currents for the corresponding MSB current mirror branches according to the reference current.

In some embodiments, the voltage detection module is configured to take the voltage signal corresponding to the output current of one of the current mirror parallel branches first sampled by the calibration resistor as a reference voltage, take the voltage signals corresponding to the output currents of the other current mirror parallel branches subsequently sampled by the calibration resistor as respective detection voltages, and sequentially compare each of the detection voltages with the reference voltage, until each of the detection voltages is equal to or larger than the reference voltage, or the compensation current supplied by the corresponding current mirror compensation circuit reaches a maximum compensation current.

In some embodiments, the voltage detection module is configured to be a voltage comparator, or an analog-to-digital converter in the SoC baseband chip.

In some embodiments, each of the current mirror compensation circuits includes at least one current mirror compensation branch, and the current mirror compensation branch is connected in parallel with the corresponding MSB current mirror branch.

In some embodiments, the current mirror compensation branch includes a first MOS transistor, a second MOS transistor, a third MOS transistor, a fourth MOS transistor, and a fifth MOS transistor.

A gate of the first MOS transistor, a gate of the second MOS transistor, a gate of the third MOS transistor, and a gate of the fourth MOS transistor are connected with each other and are connected to the calibration control module; a drain of the first MOS transistor, a drain of the second MOS transistor, a drain of the third MOS transistor, and a drain of the fourth MOS transistor are connected to an input power of the current steering digital-to-analog converter; a source of the first MOS transistor, a source of the second MOS transistor, a source of the third MOS transistor, and a source of the fourth MOS transistor are connected to a drain of the fifth MOS transistor; a gate of the fifth MOS transistor is connected to the calibration control module, and a source of the fifth MOS transistor is connected to the calibration switching switch module.

In some embodiments, the calibration switching switch module includes at least one switching switch branch. The number of the switching switch branches is equal to the number of the current mirror parallel branches; each of the switching switch branches is respectively connected to each of the current mirror parallel branches and the calibration control module, and respectively connected to the calibration resistor and the load resistor; and each of the switching switch branches is configured to connect the current mirror parallel branch connected thereto to the calibration resistor or to the load resistor.

In some embodiments, the switching switch branch includes a sixth MOS transistor and a seventh MOS transistor.

A gate of the sixth MOS transistor and a gate of the seventh MOS transistor are connected to the calibration control module; a drain of the sixth MOS transistor and a drain of the seventh MOS transistor are connected to the corresponding current mirror parallel branch; and a source of the sixth MOS transistor is grounded via the calibration resistor, and a source of the seventh MOS transistor is grounded via the load resistor.

In some embodiments, the voltage detection module is configured to take the voltage signal corresponding to the output current of one of the current mirror parallel branches first sampled by the calibration resistor as a reference voltage, take the voltage signals corresponding to the output currents of the other current mirror parallel branches subsequently sampled by the calibration resistor as respective detection voltages, and sequentially compare each of the detection voltages with the reference voltage, until each of the detection voltages is equal to or larger than the reference voltage, or the compensation current supplied by the corresponding current mirror compensation circuit reaches a maximum compensation current.

In accordance with the present disclosure, the current mirror compensation circuits supply the compensation currents for the MSB current mirror branches. The calibration resistor samples the output currents of the current mirror parallel branches one by one, converts the sampled currents into the voltage signals, and outputs the voltage signals to the voltage detection module. In addition, since the resistance value of the calibration resistor is $2^N-1$ times the resistance value of the load resistor, the voltage signal converted from the current sampled by the calibration resistor is $2^N-1$ times the voltage signal converted from the current sampled by the load resistor. By this, the voltage detection module is able to detect mismatch error between the output currents of the MSB current mirror branches, and feed back the detection results to the calibration control module. Accordingly, based on the detection results, the calibration control module can adjust the compensation currents of the current mirror compensation circuits, so as to calibrate the output currents of the current mirror array in the current steering digital-to-analog. Thus, the mismatch error occurring between the output currents of the current mirror array in the SoC baseband chip of 28 nm process or even a smaller process dimension can be reduced, thereby improving the conversion accuracy of the digital-to-analog.

The realizing of the aim, functional characteristics and advantages of the present disclosure are further described in detail with reference to the accompanying drawings and the embodiments.

DETAILED DESCRIPTION OF THE EMBODIMENTS

It will be appreciated that the specific embodiments described herein are merely illustrative of the present disclosure and are not intended to limit the present disclosure.

The present disclosure provides a mismatch calibration circuit for a current steering digital-to-analog converter of a SoC baseband chip.

Figure 1:
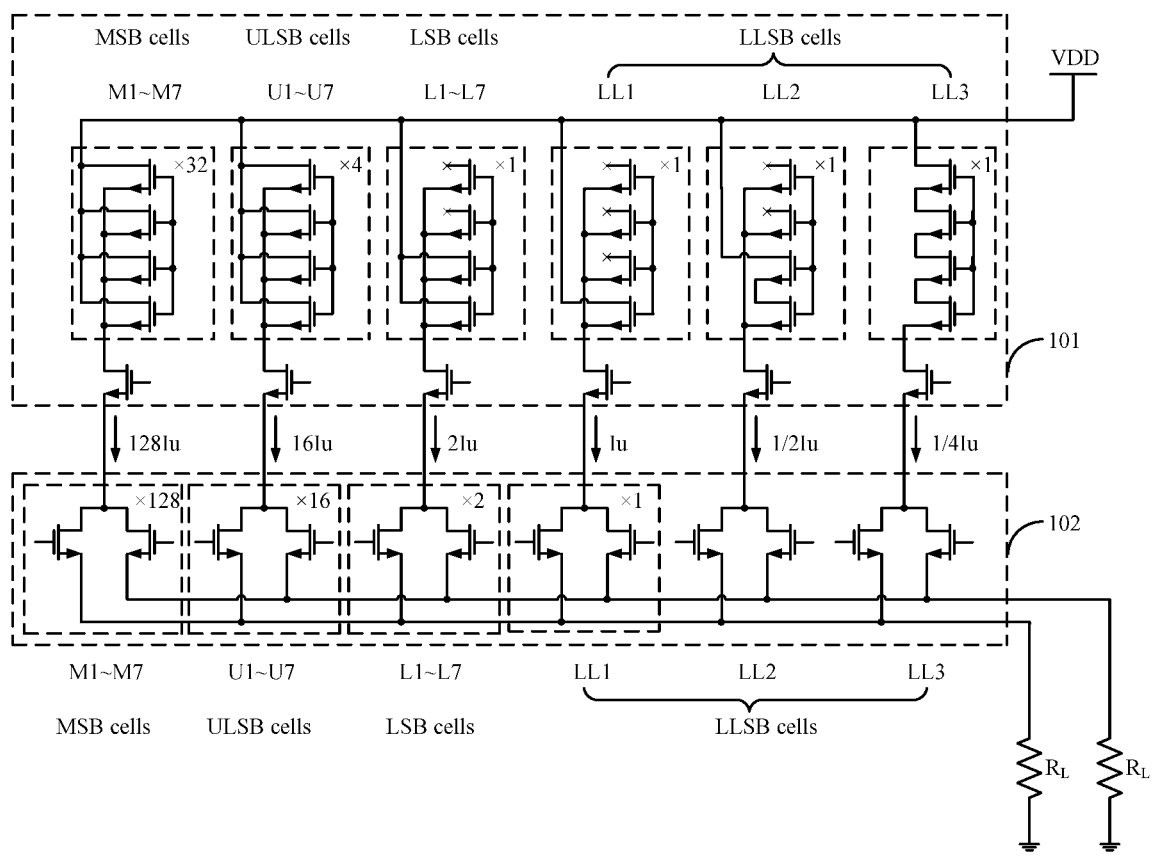
FIG. 1 is a structural schematic view of part of a current steering digital-to-analog of a SoC baseband chip according to the related art.
Figure 2:
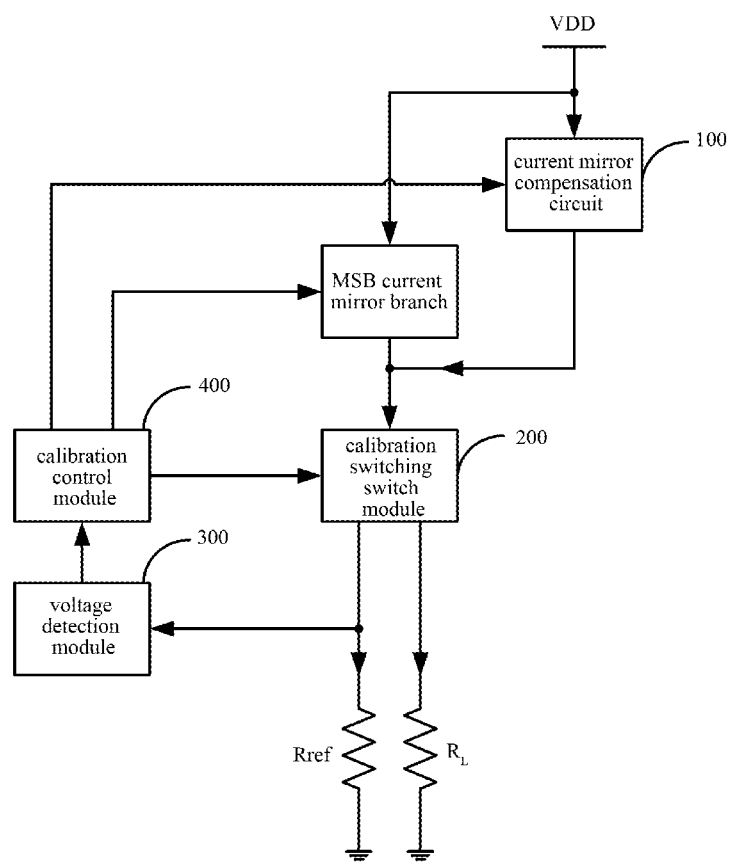
FIG. 2 is a structural schematic view of a mismatch calibration circuit of a current steering digital-to-analog of a SoC baseband chip according to a preferable embodiment of the present disclosure.

Please refer to FIG. 2 FIG. 2 is a structural schematic view of a mismatch calibration circuit of a current steering digital-to-analog of a SoC baseband chip according to a preferable embodiment of the present disclosure.

In an embodiment, as shown in FIG. 2, the mismatch calibration circuit includes current mirror compensation circuits 100, a calibration switching switch module 200, a calibration resistor Rref, a voltage detection module 300, and a calibration control module 400.

The resistance value of the calibration resistor Rref is $2^N-1$ times the resistance value of the load resistor $R_L$; N is the number of bits of MSB cells. For example, if the MSB cells in the 12-bit current steering digital-to-analog contain 3 bits, namely N=3, then the resistance value of the calibration resistor Rref is seven times the resistance value of the load resistor $R_L$.

The number of the current mirror compensation circuits 100 is equal to the number of the MSB current mirror branches. Each of the current mirror compensation circuits 100 is connected in parallel with each of the MSB current mirror branches to form each of current mirror parallel branches. One end of the current mirror parallel branch is connected to an input power VDD of the current steering digital-to-analog, and the other end of the current mirror parallel branch is connected to an input end of the calibration switching switch module 200. An output end of the calibration switching switch module 200 is grounded respectively via the calibration resistor Rref and the load resistor $R_L$. The voltage detection module 300 is respectively connected to the calibration resistor Rref and the calibration control module 400. The calibration control module 400 is respectively connected to the MSB current mirror branches, the current mirror compensation circuits 100 and the calibration switching switch module 200.

The current mirror compensation circuit 100 is configured supply a compensation current for the corresponding MSB current mirror branch. The calibration switching switch module 200 is configured to, under control of the calibration control module 400, sequentially connect one of the current mirror parallel branches to the calibration resistor Rref, and connect the other current mirror parallel branches to the load resistor $R_L$.

The calibration control module 400 is configured to determine a reference current according to the output currents of the MSB current mirror branches, and control the current mirror compensation circuits 100 to supply the compensation currents. The calibration resistor Rref is configured to sample currents of the current mirror parallel branches, convert the sampled currents to the voltage signals, and sent the voltage signals to the voltage detection module 300. The voltage detection module 300 is configured to detect the voltage signals, and feed back detection results to the calibration control module 400. As such, the calibration control module 400 can adjust the compensation currents of the current mirror compensation circuits 100, so as to calibrate the output currents of the current mirror array in the current steering digital-to-analog.

Compared with the related art, in accordance with the present disclosure, the current mirror compensation circuits 100 supply the compensation currents, the calibration resistor Rref samples the output currents of the current mirror parallel branches one by one, converts the sampled currents into the voltage signals, and outputs the voltage signals to the voltage detection module 300. In addition, since the resistance value of the calibration resistor is $2^N-1$ times the resistance value of the load resistor, the voltage signal converted from the current sampled by the calibration resistor is $2^N-1$ times the voltage signal converted from the current sampled by the load resistor. By this, the voltage detection module 300 is able to detect mismatch error occurring between the output current of each of the MSB current mirror branches, and feed back the detection result to the calibration control module 400. Accordingly, based on the detection result, the calibration control module 400 can adjust the compensation current of each of the current mirror compensation circuits 100, so as to calibrate the output currents of the current mirror array in the current steering digital-to-analog. Thus, the mismatch error occurring between the output currents of the current mirror array in the SoC baseband chip of 28 nm process or even a smaller process dimension can be reduced, thereby improving conversion accuracy of the digital-to-analog.

In the embodiment, the calibration control module 400 is configured to, according to the output currents of the MSB current mirror branches, determine one of the output currents of the current mirror parallel branches as the reference current, and control, according to the reference current, the current mirror compensation circuits 100 to supply the compensation currents for the corresponding MSB current mirror branches.

Alternatively, the calibration control module 400 is configured to, according to the output currents of the MSB current mirror branches, determine an average value of the output currents of all the current mirror parallel branches as the reference current, and control, according to the reference current, the current mirror compensation circuits 100 to supply the compensation currents for the corresponding MSB current mirror branches.

The voltage detection module 300 is configured to take the voltage signal corresponding to the output current of the current mirror parallel branch first sampled by the calibration resistor Rref as the reference voltage, and take the voltage signals corresponding to the output currents of the current mirror parallel branches subsequently sampled by the calibration resistor Rref as the detection voltages. In addition, the voltage detection module 300 sequentially compares each of the detection voltages with the reference voltage, until each of the detection voltages is equal to or larger than the reference voltage, or the compensation current supplied by each of the current mirror compensation circuits reaches a maximum compensation current.

In order to ensure accuracy and reliability of the detection result, the above reference voltage and the detection voltages are each an average value of a plurality of voltage signal values converted from a plurality of output currents sampled by the calibration resistor Rref.

In an embodiment, the voltage detection module 300 may be a voltage detector, or an analog-to-digital converter in the SoC baseband chip. By using the voltage comparator to detect the voltage signal corresponding to the current sampled by the calibration resistor Rref, the overall structure is simple and easy to implement. By using the analog-to-digital converter in the SoC baseband chip to detect the voltage signal corresponding to the current sampled by the calibration resistor Rref, there is no need to additionally provide the voltage comparator, which is advantageous for cost saving and the miniaturization of the SoC baseband chip.

Figure 3:
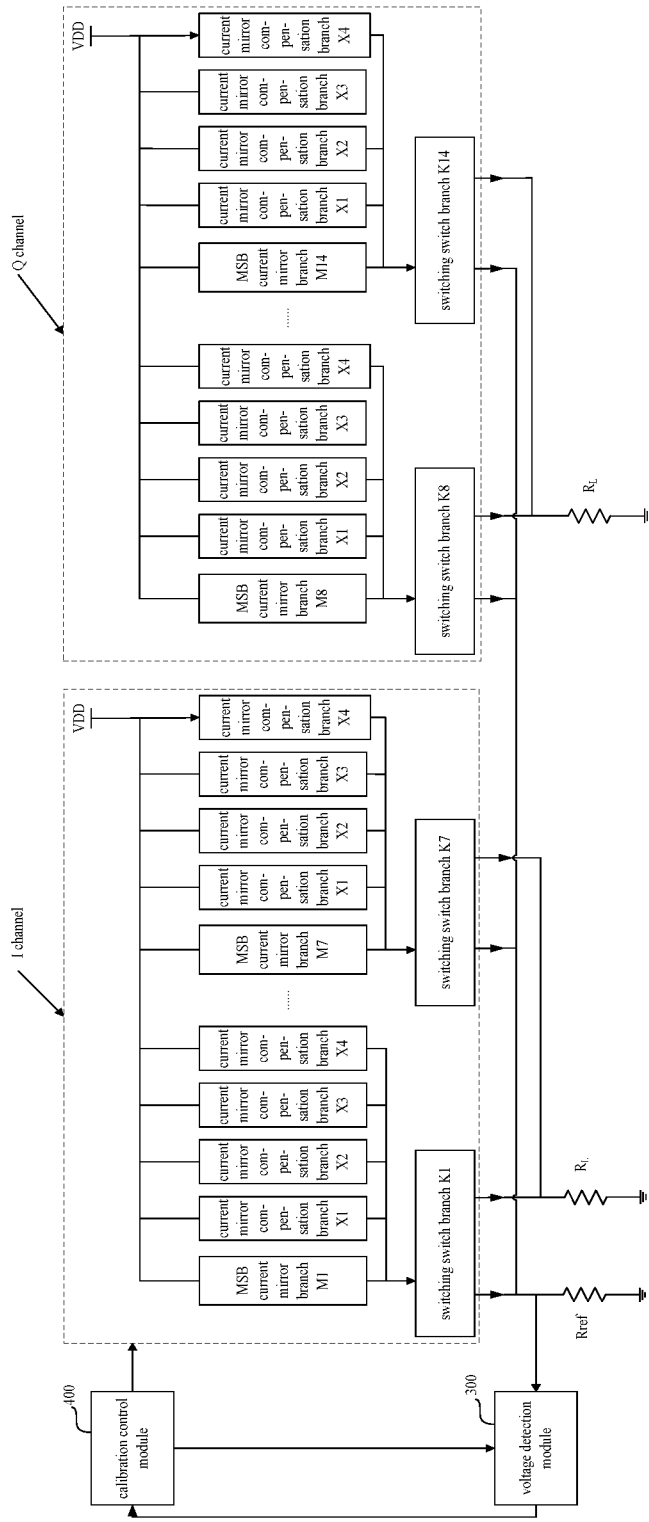
FIG. 3 is a structural schematic view of a mismatch calibration circuit of a current steering digital-to-analog of a SoC baseband chip according to a specific embodiment of the present disclosure.

Please refer to FIG. 3, FIG. 3 is a structural schematic view of a mismatch calibration circuit of a current steering digital-to-analog of a SoC baseband chip according to a specific embodiment of the present disclosure.

Specifically, in an embodiment, the current mirror compensation circuit 100 in FIG. 2 includes at least one current mirror compensation branch. The at least one current mirror compensation branch is connected in parallel with each of the MSB current mirror branches. As shown in FIG. 3, in this embodiment, the SoC baseband chip includes an I-channel DAC and a Q-channel DAC. The I-channel DAC and the Q-channel DAC each includes the 3-bit MSB current mirror cell, and correspondingly each includes seven MSB current mirror branches, a total of fourteen MSB current mirror branches, for example, the MSB current mirror branches M1 to M7, and the MSB current mirror branches M8 to M14. In this embodiment, the current mirror compensation circuit 100 includes four current mirror compensation branches (a current mirror compensation branch X1, a current mirror compensation branch X2, a current mirror compensation branch X3, and a current mirror compensation branch X4). For the I-channel and the Q-channel, each MSB current mirror branch is connected in parallel with the four current mirror compensation branches.

It will be appreciated that the number of the current mirror compensation branches is determined according to the compensation current required for each compensation and the compensation current supplied by each current mirror compensation branch. For example, suppose that the maximum compensation current required for each compensation is 0.8 μA, and the current supplied by each current mirror compensation branch is 0.2 μA, four current mirror compensation branches are required.

Figure 4:
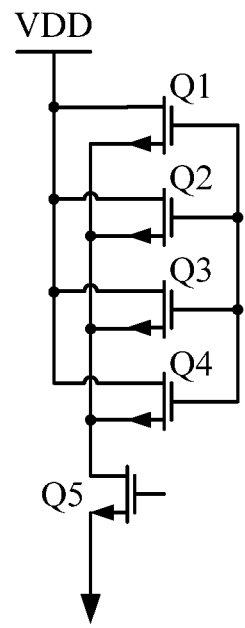
FIG. 4 is a structural schematic view of the current mirror compensation branch shown in FIG. 3.

Please refer to FIG. 4, FIG. 4 is a structural schematic view of the current mirror compensation branch shown in FIG. 3.

Each of the current mirror compensation branches in the current mirror compensation circuit 100 has the same structure. As shown in FIG. 4, the current mirror compensation branch includes a first MOS transistor Q1, a second MOS transistor Q2, a third transistor Q3, a fourth transistor Q4, and a fifth transistor Q5. The first MOS transistor Q1, the second MOS transistor Q2, the third transistor Q3, the fourth MOS transistor Q4, and the fifth MOS transistor Q5 may all be PMOS transistors, or NMOS transistors.

The gate of the first MOS transistor Q1, the gate of the second MOS transistor Q2, the gate of the third MOS transistor Q3, and the gate of the fourth MOS transistor Q4 are connected with each other, and are all connected to the calibration control module 400 (not shown in FIG. 4). The drain of the first MOS transistor Q1, the drain of the second MOS transistor Q2, the drain of the third MOS transistor Q3, and the drain of the fourth MOS transistor Q4 are all connected to an input power VDD of the current steering digital-to-analog. The source of the first MOS transistor Q1, the source of the second MOS transistor Q2, the source of the third MOS transistor Q3, and the source of the fourth MOS transistor Q4 are all connected to the drain of the fifth MOS transistor Q5. The gate of the fifth MOS transistor Q5 is connected to the calibration control module 400 (not shown in FIG. 4). The source of the fifth MOS transistor Q5 is connected to the calibration switching switch module 200 (not shown in FIG. 4).

As shown in FIGS. 2 to 4, when the calibration control module 400 outputs a high-level signal to the gate of the first MOS transistor Q1, the gate of the second MOS transistor Q2, the gate of the third MOS transistor Q3, the gate of the fourth MOS transistor Q4, and the gate of the fifth MOS transistor Q5, the first MOS transistor Q1, the second MOS transistor Q2, the third MOS transistor Q3, the fourth MOS transistor Q4, and the fifth MOS transistor Q5 are all turned on; otherwise, when the calibration control module 400 outputs a low-level signal to the gate of the first MOS transistor Q1, the gate of the second MOS transistor Q2, the gate of the third MOS transistor Q3, the gate of the fourth MOS transistor Q4, and the gate of the fifth MOS transistor Q5, the first MOS transistor Q1, the second MOS transistor Q2, the third MOS transistor Q3, the fourth MOS transistor Q4, and the fifth MOS transistor Q5 are all turned off. By controlling the on-off state of the first MOS transistor Q1, the second MOS transistor Q2, the third MOS transistor Q3, the fourth MOS transistor Q4, and the fifth MOS transistor Q5, as well as the on-off time period, the calibration control module 400 is able to control the compensation current magnitude of the current mirror compensation branch.

Further, in an embodiment, the calibration switching switch module 200 includes at least one switching switch branch. The number of the switching switch branches is equal to the number of the current mirror parallel branches. As shown in FIG. 3, in this embodiment, the SoC baseband chip includes the I-channel DAC and the Q-channel DAC. The I-channel DAC and the Q-channel DAC each includes the 3-bit MSB current mirror cell, and each includes seven MSB current mirror branches, a total of fourteen MSB current mirror branches, for example, the MSB current mirror branches M1 to M7, and the MSB current mirror branches M8 to M14. Therefore, for the I-channel and the Q channel, the number of the current mirror parallel branches formed by the MSB current mirror branches and the current mirror compensation circuits 100 are both a total of seven, the calibration switching switch module 200 includes seven switching switch branches, for example, the switching switch branches K1 to K7, and the switching switch branches K8 to K14 as shown in FIG. 3. The switching switch branch is respectively connected to the current mirror parallel branch and the calibration control module 400, and respectively connected to the calibration resistor Rref and the load resistor $R_L$. The switching switch branch is configured to connect the current mirror parallel branch connected thereto to the calibration resistor Rref or to the load resistor $R_L$.

By switching the switching switch branch, the current mirror parallel branch connected thereto can be connected to the calibration resistor Rref or the load resistor $R_L$, such that the particular MSB current mirror branch can be calibrated.

Figure 5:
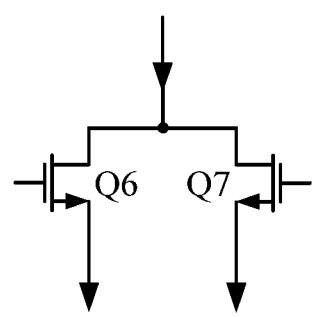
FIG. 5 is a structural schematic view of the switching switch branch shown in FIG. 3.

Refer to FIG. 5, FIG. 5 is a structural schematic view of the switching switch branch shown in FIG. 3.

Each of the switching switch branches in the calibration switching switch module 200 has a same structure. As shown in FIG. 5, the switching switch branch includes a sixth MOS transistor Q6 and a seventh MOS transistor Q7. The sixth MOS transistor Q6 and the seventh MOS transistor Q7 may be both PMOS transistors, or NMOS transistors.

The gate of the sixth MOS transistor Q6 and the gate of the seventh MOS transistor Q7 are both connected to the calibration control module 400 (not shown in FIG. 5). The drain of the sixth MOS transistor Q6 and the drain of the seventh MOS transistor Q7 are both connected to the current mirror parallel branch (not shown in FIG. 5). The source of the sixth MOS transistor Q6 is grounded via the calibration resistor Rref. The source of the seventh MOS transistor Q7 is grounded via the load resistor $R_L$.

As shown in FIGS. 2 to 5, when the calibration control module 400 outputs a high-level signal to the gate of the sixth MOS transistor Q6 and the gate of the seventh MOS transistor Q7, the gate of the sixth MOS transistor Q6 and the seventh MOS transistor Q7 are electrically conductive; and when the calibration control module 400 outputs a low-level signal to the gate of the sixth MOS transistor Q6 and the gate of the seventh MOS transistor Q7, the gate of the sixth MOS transistor Q6 and the seventh MOS transistor Q7 are electrically conductive. In response to that the calibration control module 400 controls the sixth MOS transistor Q6 to be on and the seventh MOS transistor Q7 to be off, the current mirror parallel branch connected to the gate of the sixth MOS transistor Q6 and the seventh MOS transistor Q7 is connected to calibration resistor Rref via the sixth MOS transistor Q6, that is, the MSB current mirror branch and the current mirror compensation circuit 100 are both connected to the calibration resistor Rref via the sixth MOS transistor Q6, and accordingly the MSB current mirror branch is in the current calibration state. In response to that the calibration control module 400 controls the sixth MOS transistor Q6 to be off and the seventh MOS transistor Q7 to be on, the current mirror parallel branch connected to the gate of the sixth MOS transistor Q6 and the seventh MOS transistor Q7 is connected to load resistor $R_L$, that is, the MSB current mirror branch and the current mirror compensation circuit 100 are both connected to the load resistor $R_L$ via the seventh MOS transistor Q7, and accordingly the other MSB current mirror branches connected to the sixth MOS transistor Q6 and the calibration resistor Rref are in the current calibration state.

Combined with to FIGS. 2 to 5, a work process of the mismatch calibration circuit is described as follows:

In this embodiment, a SoC baseband chip includes an I-channel DAC and a Q-channel DAC. The I-channel DAC and the Q-channel DAC each includes the 3-bit MSB current mirror cell, and correspondingly each includes seven MSB current mirror branches M1 to M7, a total of fourteen MSB current mirror branches.

The sequence for calibrating the fourteen MSB current mirror branches is in no particular order. Herein the current calibration is performed from the first MSB current mirror branch M1. Suppose that each MSB current mirror branch can supply a current of 100 µA, but in fact, an error occurs in the current output of each of the MSB current mirror branches. Typically, each of the MSB current mirror branches supplies an actual current of 100 µA±∂, that is, an error of ±∂. In an embodiment, according to the characteristic of the SoC baseband chip, suppose that the error of each MSB current mirror branch is 0.4%, that is, ±0.4 µA, and accordingly the current for each MSB current mirror branch is 0~0.8 µA, namely the maximum compensation current is 0.8 µA.

The following is an example for describing a mismatch calibration process performed on the output currents of the MSB current mirror branches:

First, the calibration control module 400 takes the output current of the first MSB current mirror branch M1 in the I-channel DAC as the reference current, controls the current mirror compensation circuit 100 connected in parallel with the first MSB current mirror branch M1 to supply the compensation current of 0.4 µA; and controls the sixth MOS transistor Q6 in the first switching switch branch K1 to be on and the seventh MOS transistor Q7 in the first switching switch branch K1 to be off, while controls the sixth MOS transistors Q6 in the other switching switch branches K2 to K14 to be off and the seventh MOS transistors Q7 in the other switching switch branches K2 to K14 to be on, such that the first current mirror parallel branch formed by the first MSB current mirror branch M1 and the corresponding current mirror compensation circuit 100 is connected to the sixth MOS transistor Q6 and then grounded via the calibration resistor Rref. The other current mirror parallel branches formed by the other MSB current mirror branches and the corresponding current mirror compensation circuits 100 in the I-channel DAC are connected to the load resistor $R_L$ in the I-channel DAC; and the current mirror parallel branches formed by the other MSB current mirror branches and the corresponding current mirror compensation circuits 100 in the Q-channel DAC are connected to the load resistor $R_L$ in the Q-channel DAC. As such, the output current of the first current mirror parallel branch M1 passes through the calibration resistor Rref, and thus can be converted into the corresponding voltage signal for outputting to the voltage detection module 300. The voltage detection module 300 takes an average value of a plurality of the received voltage signals as the reference voltage.

Next, the calibration control module 400 takes the output current of the second MSB current mirror branch M2 in the I-channel DAC as the reference current, controls the compensation current supplied by the current mirror compensation circuit 100 connected in parallel with the second MSB current mirror branch M2 to be zero, that is, no compensation current (herein first assuming that the current of the second MSB current mirror branch M2 is equal to the compensated current of the first MSB current mirror branch M1); controls the sixth MOS transistor Q6 in the second switching switch branch K2 to be on and the seventh MOS transistor Q7 in the second switching switch branch K2 to be off, and controls the sixth MOS transistors Q6 in the other switching switch branches K1, K3 to K14 to be off, the seventh MOS transistors Q7 in the other switching switch branches K1, K3 to K14 to be on, such that the second current mirror parallel branch formed by the second MSB current mirror branch M2 and the corresponding current mirror compensation circuit 100 is connected to the sixth MOS transistors Q6, and then grounded via the calibration resistor Rref. The other current mirror parallel branches formed by the other MSB current mirror branches and the corresponding current mirror compensation circuits 100 in the I-channel DAC are connected to the load resistor $R_L$ in the I-channel DAC; and the current mirror parallel branches formed by the MSB current mirror branches and the corresponding current mirror compensation circuits 100 in the Q-channel DAC are connected to the load resistor $R_L$ in the Q-channel DAC. As such, the output current of the second current mirror parallel branch M2 passes through the calibration resistor Rref, and thus can be converted into the corresponding voltage signal for outputting to the voltage detection module 300. The voltage detection module 300 takes an average value of a plurality of the received voltage signals as the detection voltage.

The voltage detection module 300 compares the detection voltage with the reference voltage. If the detection voltage is less than the reference voltage, that is, the voltage detection module 300 detects that error occurs between the current of the second current mirror parallel branch M2 and the compensated current of the first current mirror parallel branch M1, the voltage detection module 300 feeds back the detection result to the calibration control module 400. The calibration control module 400 controls the compensation current supplied by the current mirror compensation circuit 100 connected in parallel with the second MSB current mirror branch M2 to be 0.2 μA (the compensation current herein is an assumed value of the compensation current, for example, it may be 0.1 μA or 0.4 μA, etc.). Then the voltage detection module 300 compares the currently received detection voltage with the reference voltage. If the currently received detection voltage is no smaller than the reference voltage, then the calibration for the output current of the second current mirror parallel branch is finished; if the currently received detection voltage is smaller than the reference voltage, then the calibration control module 400 continues to control the corresponding current mirror compensation circuit 100 to supply the compensation current, until that the voltage detected by the detection module 300 is no longer smaller than the reference voltage or that the compensation current supplied by the current mirror compensation circuit 100 for the second MSB current mirror branch M2 reaches a maximum compensation current of 0.8 μA. Similarly, the above calibration process of the second MSB current mirror branch M2 sequentially applies to the third MSB current mirror branch to the fourteenth MSB current mirror branch M14, so as to complete the whole calibration.

The present disclosure further provides a SoC baseband chip, including a mismatch calibration circuit for a current steering digital-to-analog. It should be understood that since the mismatch calibration circuit adopts all the technical solutions of the above embodiments, thus can achieve all the technical effects introduced by the above mismatch calibration circuits, which is not detailed herein.

The foregoing description merely portrays some illustrative embodiments in accordance with the disclosure and therefore is not intended to limit the patentable scope of the disclosure. Any equivalent structure or flow transformations that are made taking advantage of the specification and accompanying drawings of the disclosure and any direct or indirect applications thereof in other related technical fields shall all fall in the scope of protection of the disclosure.

What is claimed is:

1. A mismatch calibration circuit for a current steering digital-to-analog converter of a system-on-chip (SoC) baseband chip, comprising current mirror compensation circuits, a calibration switching switch module, a calibration resistor, a voltage detection module, and a calibration control module; wherein:
   a resistance value of the calibration resistor is $2^N-1$ times as a resistance value of a load resistor in the current steering digital-to-analog converter, wherein N is the number of bits of most significant bit (MSB) cells;
   the number of the current mirror compensation circuits is equal to the number of MSB current mirror branches in the current steering digital-to-analog converter, each of the current mirror compensation circuits is connected in parallel with each of the MSB current mirror branches to form each of current mirror parallel branches; an input end of the calibration switching switch module is connected to the current mirror parallel branches, and an output end of the calibration switching switch module is grounded respectively via the calibration resistor and the load resistor; the voltage detection module is respectively connected to the calibration resistor and the calibration control module; the calibration control module is respectively connected to the MSB current mirror branches, the current mirror compensation circuits, and the calibration switching switch module;
   the current mirror compensation circuits are configured to supply compensation currents for the MSB current mirror branches; the calibration switching switch module is configured to, under control of the calibration control module, sequentially connect one of the current mirror parallel branches to the calibration resistor, and connect the other current mirror parallel branches to the load resistor; and
   the calibration control module is configured to, according to output currents of the MSB current mirror branches, determine a reference current, and control the current mirror compensation circuits to supply the compensation currents; the calibration resistor is configured to sample currents of the current mirror parallel branches, convert the sampled currents to voltage signals and send the voltage signals to the voltage detection module; the voltage detection module is configured to detect the voltage signals, and feed back detection results to the calibration control module; and the calibration control module is configured to adjust the compensation currents of the current mirror compensation circuits, so as to calibrate output currents of a current mirror array in the current steering digital-to-analog converter.

2. The mismatch calibration circuit according to claim 1, wherein the calibration control module is configured to, according to the output currents of the MSB current mirror branches, determine one of the output currents of the current mirror parallel branches as the reference current, and control the current mirror compensation circuits to supply the compensation currents for the corresponding MSB current mirror branches based on the reference current.

3. The mismatch calibration circuit according to claim 1, wherein the calibration control module is configured to, according to the output currents of the MSB current mirror branches, determine an average value of the output currents of all of the current mirror parallel branches as the reference current, and control the current mirror compensation circuits to supply the compensation currents for the corresponding MSB current mirror branches based on the reference current.

4. The mismatch calibration circuit according to claim 2, wherein the voltage detection module is configured to take the voltage signal corresponding to the output current of one of the current mirror parallel branches first sampled by the calibration resistor as a reference voltage, take the voltage signals corresponding to the output currents of the other current mirror parallel branches subsequently sampled by the calibration resistor as respective detection voltages, and sequentially compare each of the detection voltages with the reference voltage, until each of the detection voltages is equal to or larger than the reference voltage, or the compensation current supplied by the corresponding current mirror compensation circuit reaches a maximum compensation current.

5. The mismatch calibration circuit according to claim 1, wherein the voltage detection module is configured to be a voltage comparator, or an analog-to-digital converter in the SoC baseband chip.

6. The mismatch calibration circuit according to claim 1, wherein each of the current mirror compensation circuits comprises at least one current mirror compensation branch, and the current mirror compensation branch is connected in parallel with the corresponding MSB current mirror branch.

7. The mismatch calibration circuit according to claim 6, wherein the current mirror compensation branch comprises a first MOS transistor, a second MOS transistor, a third MOS transistor, a fourth MOS transistor, and a fifth MOS transistor; wherein:

a gate of the first MOS transistor, a gate of the second MOS transistor, a gate of the third MOS transistor, and a gate of the fourth MOS transistor are connected with each other and are connected to the calibration control module;

a drain of the first MOS transistor, a drain of the second MOS transistor, a drain of the third MOS transistor, and a drain of the fourth MOS transistor are connected to an input power of the current steering digital-to-analog converter;

a source of the first MOS transistor, a source of the second MOS transistor, a source of the third MOS transistor, and a source of the fourth MOS transistor are connected to a drain of the fifth MOS transistor;

a gate of the fifth MOS transistor is connected to the calibration control module, and a source of the fifth MOS transistor is connected to the calibration switching switch module.

8. The mismatch calibration circuit according to claim 1, wherein the calibration switching switch module comprises at least one switching switch branch; wherein:
the number of the switching switch branches is equal to the number of the current mirror parallel branches;
the switching switch branches is respectively connected to the corresponding current mirror parallel branch and the calibration control module, and respectively connected to the calibration resistor and the load resistor; and
the switching switch branches is configured to connect the current mirror parallel branch connected thereto to the calibration resistor or to the load resistor.

9. The mismatch calibration circuit according to claim 8, wherein the switching switch branch comprises a sixth MOS transistor and a seventh MOS transistor; wherein:
a gate of the sixth MOS transistor and a gate of the seventh MOS transistor are connected to the calibration control module;
a drain of the sixth MOS transistor and a drain of the seventh MOS transistor are connected to the corresponding current mirror parallel branch; and
a source of the sixth MOS transistor is grounded via the calibration resistor, and a source of the seventh MOS transistor is grounded via the load resistor.

10. The mismatch calibration circuit according to claim 3, wherein the voltage detection module is configured to take the voltage signal corresponding to the output current of one of the current mirror parallel branches first sampled by the calibration resistor as a reference voltage, take the voltage signals corresponding to the output currents of the other current mirror parallel branches subsequently sampled by the calibration resistor as respective detection voltages, and sequentially compare each of the detection voltages with the reference voltage, until each of the detection voltages is equal to or larger than the reference voltage, or the compensation current supplied by the corresponding current mirror compensation circuit reaches a maximum compensation current.

11. A system-on-chip (SoC) baseband chip, comprising a mismatch calibration circuit for a current steering digital-to-analog converter; wherein:
the mismatch calibration circuit comprises current mirror compensation circuits, a calibration switching switch module, a calibration resistor, a voltage detection module, and a calibration control module; wherein:
a resistance value of the calibration resistor is $2^N-1$ times as a resistance value of a load resistor in the current steering digital-to-analog converter, wherein N is the number of bits of most significant bit (MSB) cells;
the number of the current mirror compensation circuits is equal to the number of MSB current mirror branches in the current steering digital-to-analog converter, each of the current mirror compensation circuits is connected in parallel with each of the MSB current mirror branches to form each of current mirror parallel branches; an input end of the calibration switching switch module is connected to the current mirror parallel branches, and an output end of the calibration switching switch module is grounded respectively via the calibration resistor and the load resistor; the voltage detection module is respectively connected to the calibration resistor and the calibration control module; the calibration control module is respectively connected to the MSB current mirror branches, the current mirror compensation circuits, and connect the calibration switching switch module;
the current mirror compensation circuits are configured to supply compensation currents for the MSB current mirror branches; the calibration switching switch module is configured to, under control of the calibration control module, sequentially connect one of the current mirror parallel branches to the calibration resistor, and the other current mirror parallel branches to the load resistor; and
the calibration control module is configured to, according to output currents of the MSB current mirror branches, determine a reference current, and control the current mirror compensation circuits to supply the compensation currents; the calibration resistor is configured to sample currents of the current mirror parallel branches, convert the sampled currents to voltage signals and send the voltage signals to the voltage detection module; the voltage detection module is configured to detect the voltage signals, and feed back detection results to the calibration control module; and the calibration control module is configured to adjust the compensation currents of the current mirror compensation circuits, so as to calibrate output currents of a current mirror array in the current steering digital-to-analog converter.

12. The SoC baseband chip according to claim 11, wherein the calibration control module is configured to, according to the output currents of the MSB current mirror branches, determine one of the output currents of the current mirror parallel branches as the reference current, and control the current mirror compensation circuits to supply the compensation currents for the corresponding MSB current mirror branches according to the reference current.

13. The SoC baseband chip according to claim 11, wherein the calibration control module is configured to, according to the output currents of the MSB current mirror branches, determine an average value of the output currents of all of the current mirror parallel branches as the reference current, and control the current mirror compensation circuits to supply the compensation currents for the corresponding MSB current mirror branches according to the reference current.

14. The SoC baseband chip according to claim 12, wherein the voltage detection module is configured to take the voltage signal corresponding to the output current of one of the current mirror parallel branches first sampled by the calibration resistor as a reference voltage, take the voltage signals corresponding to the output currents of the other current mirror parallel branches subsequently sampled by the calibration resistor as respective detection voltages, and sequentially compare each of the detection voltages with the reference voltage, until each of the detection voltages is equal to or larger than the reference voltage, or the compensation current supplied by the corresponding current mirror compensation circuit reaches a maximum compensation current.

15. The SoC baseband chip according to claim 11, wherein the voltage detection module is configured to be a voltage comparator, or an analog-to-digital converter in the SoC baseband chip.

16. The SoC baseband chip according to claim 11, wherein each of the current mirror compensation circuits comprises at least one current mirror compensation branch, and the current mirror compensation branch is connected in parallel with the corresponding MSB current mirror branch.

17. The SoC baseband chip according to claim 16, wherein the current mirror compensation branch comprises a first MOS transistor, a second MOS transistor, a third MOS transistor, a fourth MOS transistor, and a fifth MOS transistor; wherein:
  a gate of the first MOS transistor, a gate of the second MOS transistor, a gate of the third MOS transistor, and a gate of the fourth MOS transistor are connected with each other and are connected to the calibration control module;
  a drain of the first MOS transistor, a drain of the second MOS transistor, a drain of the third MOS transistor, and a drain of the fourth MOS transistor are connected to an input power of the current steering digital-to-analog converter;
  a source of the first MOS transistor, a source of the second MOS transistor, a source of the third MOS transistor, and a source of the fourth MOS transistor are connected to a drain of the fifth MOS transistor;
  a gate of the fifth MOS transistor is connected to the calibration control module, and a source of the fifth MOS transistor is connected to the calibration switching switch module.

18. The SoC baseband chip according to claim 11, wherein the calibration switching switch module comprises at least one switching switch branch; wherein:
  the number of the switching switch branches is equal to the number of the current mirror parallel branches;
  the switching switch branches is respectively connected to the corresponding current mirror parallel branch and the calibration control module, and respectively connected to the calibration resistor and the load resistor; and
  the switching switch branches is configured to connect the current mirror parallel branch connected thereto to the calibration resistor or to the load resistor.

19. The SoC baseband chip according to claim 18, wherein the switching switch branch comprises a sixth MOS transistor and a seventh MOS transistor; wherein:
  a gate of the sixth MOS transistor and a gate of the seventh MOS transistor are connected to the calibration control module;
  a drain of the sixth MOS transistor and a drain of the seventh MOS transistor are connected to the corresponding current mirror parallel branch; and
  a source of the sixth MOS transistor is grounded via the calibration resistor, and a source of the seventh MOS transistor is grounded via the load resistor.

20. The SoC baseband chip according to claim 13, wherein the voltage detection module is configured to take the voltage signal corresponding to the output current of one of the current mirror parallel branches first sampled by the calibration resistor as a reference voltage, take the voltage signals corresponding to the output currents of the other current mirror parallel branches subsequently sampled by the calibration resistor as respective detection voltages, and sequentially compare each of the detection voltages with the reference voltage, until each of the detection voltages is equal to or larger than the reference voltage, or the compensation current supplied by the corresponding current mirror compensation circuit reaches a maximum compensation current.

\* \* \* \* \*